United States Patent
Ando

(10) Patent No.: US 9,166,768 B2
(45) Date of Patent: Oct. 20, 2015

(54) RADIO TRANSCEIVER AND CONTROL METHOD THEREOF

(75) Inventor: Yoshiaki Ando, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 177 days.

(21) Appl. No.: 13/824,226

(22) PCT Filed: Sep. 7, 2011

(86) PCT No.: PCT/JP2011/005007
§ 371 (c)(1),
(2), (4) Date: Jun. 7, 2013

(87) PCT Pub. No.: WO2012/073405
PCT Pub. Date: Jun. 7, 2012

(65) Prior Publication Data
US 2013/0242811 A1    Sep. 19, 2013

(30) Foreign Application Priority Data
Nov. 30, 2010 (JP) .................................. 2010-266136

(51) Int. Cl.
*H04L 5/18* (2006.01)
*H04L 5/14* (2006.01)
(Continued)

(52) U.S. Cl.
CPC *H04L 5/18* (2013.01); *H04B 1/525* (2013.01); *H04L 5/14* (2013.01); *H03L 7/099* (2013.01); *H03L 7/18* (2013.01)

(58) Field of Classification Search
CPC ............ H04L 5/18; H04L 5/14; H04B 1/525; H03L 7/18; H03L 7/099
See application file for complete search history.

(56) References Cited

U.S. PATENT DOCUMENTS 5,481,564 A * 1/1996 Kakuishi et al. ............... 375/230
6,480,706 B1 * 11/2002 Mimura et al. ............... 455/140
(Continued)

FOREIGN PATENT DOCUMENTS

CN    1508982 A    6/2004
CN    1643785 A    7/2005
(Continued)

OTHER PUBLICATIONS

Office Action dated Apr. 3, 2014, issued by the State Intellectual Property Office of the P.R.C. in corresponding Chinese Application No. 201180056448.X.

*Primary Examiner* — Andrew Lai
*Assistant Examiner* — Hoyet H Andrews
(74) *Attorney, Agent, or Firm* — Sughrue Mion, PLLC

(57) ABSTRACT

In order to reduce deterioration of reception performance even further in a case of simultaneously performing transmission and reception, a transmitting circuit (20), which forms a radio transceiver (1), outputs a transmission signal (110) to be wirelessly transmitted through an antenna (10). A duplexer (30) conducts the transmission signal (110) to the antenna (10), and outputs, as differential signals ($102p$ and $102n$), a reception signal wirelessly received through the antenna (10) to a receiving circuit (40). The receiving circuit (40) regulates phases of the differential signals ($102p$ and $102n$) based on a first characteristic of the reception signal under a condition that the transmission signal (110) is not output, and a second characteristic of the reception signal under a condition that the transmission signal (110) is output. Further, the receiving circuit (40) regulates gains of the differential signals ($102p$ and $102n$) based on a result obtained by comparing the first and second characteristics after the regulation of phases.

4 Claims, 5 Drawing Sheets

(51) Int. Cl.
*H03L 7/18* (2006.01)
*H03L 7/099* (2006.01)
*H04B 1/525* (2015.01)

(56) References Cited

U.S. PATENT DOCUMENTS

| | | | |
|---|---|---|---|
| 6,989,787 B2 * | 1/2006 | Park et al. | 342/359 |
| 7,038,557 B2 * | 5/2006 | Nakamura et al. | 333/132 |
| 2002/0186757 A1 * | 12/2002 | Nakamura et al. | 375/219 |
| 2004/0106389 A1 * | 6/2004 | Chiou | 455/260 |
| 2004/0251987 A1 * | 12/2004 | Nakamura et al. | 333/133 |
| 2004/0252055 A1 * | 12/2004 | Thomas et al. | 342/372 |
| 2005/0220195 A1 | 10/2005 | Shimizu | |
| 2006/0028298 A1 * | 2/2006 | Nakamura et al. | 333/133 |
| 2008/0279122 A1 * | 11/2008 | Fukuda et al. | 370/278 |
| 2009/0130981 A1 | 5/2009 | Nagai et al. | |
| 2010/0260077 A1 | 10/2010 | Nakatani et al. | |
| 2011/0006826 A1 * | 1/2011 | Kang et al. | 327/254 |
| 2013/0242811 A1 * | 9/2013 | Ando | 370/277 |

FOREIGN PATENT DOCUMENTS

| | | |
|---|---|---|
| CN | 1681216 A | 10/2005 |
| CN | 101032101 A | 9/2007 |
| JP | 2007-158987 A | 6/2007 |
| JP | 2007-281592 A | 10/2007 |
| JP | 2009-165112 A | 7/2009 |
| WO | 2007/046303 A1 | 4/2007 |

* cited by examiner

RADIO TRANSCEIVER AND CONTROL METHOD THEREOF

CROSS REFERENCE TO RELATED APPLICATIONS

This application is a National Stage of International Application No. PCT/JP2011/005007 filed on Sep. 7, 2011, which claims priority from Japanese Patent Application No. 2010-266136, filed on Nov. 30, 2010, the contents of all of which are incorporated herein by reference in their entirety.

TECHNICAL FIELD

The present invention relates to a radio transceiver and a control method thereof. In particular, the present invention relates to a radio transceiver employing a radio system such as a WCDMA (Wideband Code Division Multiple Access) system in which transmission and reception are simultaneously performed, and a method of controlling such a radio transceiver.

BACKGROUND ART

In the radio transceiver employing the WCDMA system or the like, a duplexer separates transmission from reception and thus it is common to simultaneously perform wireless transmission and reception through an antenna. In such a radio transceiver, transmission signals are leaked into a receiving circuit through the duplexer, so that reception performance would be deteriorated.

Therefore, the duplexer is typically designed so as to reduce the influence of the transmission signals on the reception performance, by sufficiently ensuring its isolation characteristic between transmission and reception.

Further, it is also common that the duplexer has a differential connection with the receiving circuit for the purpose of accurately propagating reception signals. In this case, two signals (a pair of differential signals) are input to the receiving circuit. Thus, interference occurs within a reception bandwidth due to inter modulation, and thereby causes the deterioration of the reception performance.

Therefore, the receiving circuit is often provided with functions for reducing the interference due to the inter modulation. For example, PTL 1 discloses a radio transceiver in which current control is performed for an LNA (Low Noise Amplifier) and a mixer in a receiving circuit in order to reduce interference caused by inter modulation when transmission signals are leaked.

CITATION LIST

Patent Literature

PTL 1: International Patent Publication No. WO2007/046303
PTL 2: Japanese Unexamined Patent Application Publication No. 2009-165112

SUMMARY OF INVENTION

Technical Problem

However, there is a problem that the above-mentioned radio transceiver cannot sufficiently reduce the deterioration of the reception performance. This is because of not being able to obtain the isolation characteristic of the duplexer between transmission and reception, which could be obtained under ideal condition (50 ohm termination), due to the imbalance between differential lines from the duplexer to the receiving circuit, the imbalance between input impedances corresponding to differential lines within the receiving circuit, and the like. Note that the term "imbalance" means that there is manufacturing variability in a characteristic of each differential line, each input impedance, and the like.

Further, even though the performance for the inter modulation is improved as with the above-mentioned PTL 1, it cannot address the above-mentioned imbalance, so that the isolation between transmission and reception would be impaired.

Note that as another referential technique, PTL 2 discloses a radio transceiver in which an envelope signal is corrected and injected so as to cancel a transmission signal leaked into a receiving circuit. However, in the case where the above-mentioned imbalance occurs, it is difficult to correct the amplitude and phase of the envelope signal so as to be in phase with each differential signal, so that the isolation between transmission and reception would also be impaired.

Accordingly, an exemplary object of the present invention is to reduce deterioration of reception performance even further in a case of simultaneously performing transmission and reception.

Solution to Problem

In order to achieve the above-mentioned object, a radio transceiver according to first exemplary aspect of the present invention includes: transmission means for outputting a transmission signal to be wirelessly transmitted through an antenna; antenna duplex means for conducting the transmission signal to the antenna, and for outputting, as differential signals, a reception signal wirelessly received through the antenna; and reception means. The differential signals are input to the reception means. The reception means is configured to regulate phases of the differential signals based on a first characteristic of the reception signal under a condition that the transmission signal is not output, and a second characteristic of the reception signal under a condition that the transmission signal is output.

Further, a control method according to second exemplary aspect of the present invention provides a method of controlling a radio transceiver that uses a duplexer for conducting to an antenna a transmission signal to be wirelessly transmitted and for propagating a reception signal wirelessly received through the antenna in a differential manner. This control method includes: comparing a first characteristic of the reception signal under a condition that the transmission signal is not output with a second characteristic of the reception signal under a condition that the transmission signal is output; and regulating phases of signals propagated in the differential manner based on a result of the comparison.

Advantageous Effects of Invention

According to the present invention, it is possible to reduce deterioration of reception performance even further in a case of simultaneously performing transmission and reception.

DESCRIPTION OF EMBODIMENTS

Figure 1:
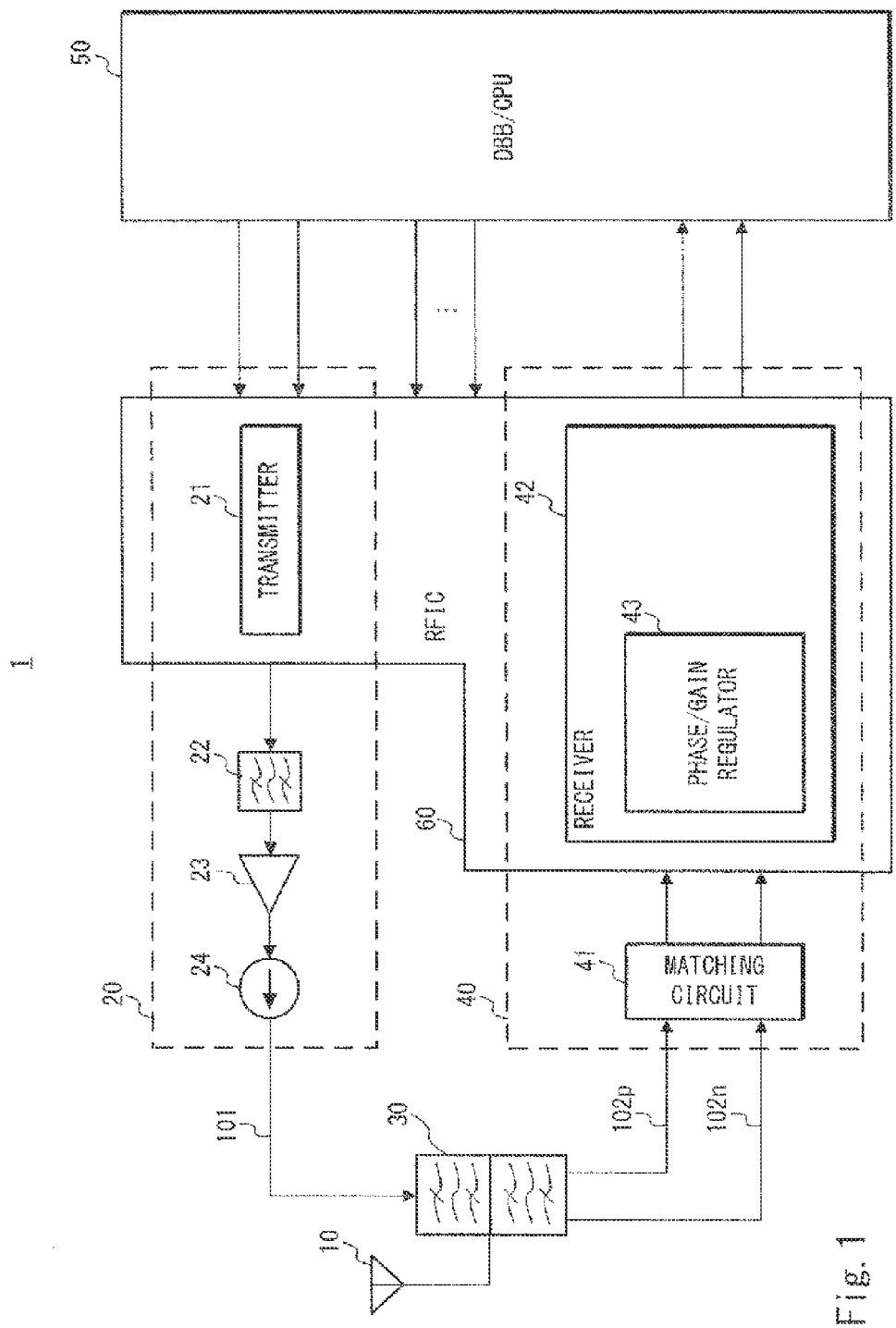
FIG. 1 is a block diagram showing a configuration example of a radio transceiver in common to first and second exemplary embodiments of the present invention.

Hereinafter, first to third exemplary embodiments of a radio transceiver according to the present invention will be described with reference to FIGS. 1 to 5. Note that in the drawings, the identical reference symbols denote identical elements and the redundant explanation thereof will be omitted as appropriate to clarify the explanation.

First Exemplary Embodiment

As shown in FIG. 1, a radio transceiver 1 according to this exemplary embodiment includes an antenna 10, a transmitting circuit 20, a duplexer 30, and a receiving circuit 40.

Among them, the transmitting circuit 20 typically outputs a transmission signal 110 to be wirelessly transmitted through the antenna 10. Specifically, as with a typical radio transceiver, the transmitting circuit 20 includes a transmitter 21, a bandpass filter 22, a power amplifier 23, and an isolator 24. The transmitter 21 up-converts baseband signals (IQ signals) generated by a DBB (Digital BaseBand)/CPU (Central Processing Unit) 50 into radio frequencies, in accordance with various control signals received from the DBB/CPU 50. The up-converted signals are band-limited by the bandpass filter 22 and amplified by the power amplifier 23, and then input as the transmission signal 110 to the duplexer 30.

The duplexer 30 performs band limitation for the transmission signal 110 to be wirelessly sent out through the antenna 10. Further, the duplexer 30 is connected to the receiving circuit 40 in a differential manner, thereby outputting, as a pair of differential signals 102$p$ and 102$n$, a reception signal wirelessly received through the antenna 10 to the receiving circuit 40. At this time, the duplexer 30 performs band limitation for the reception signal.

The receiving circuit 40 includes a matching circuit 41 and a receiver 42. The differential signals 102$p$ and 102$n$ are input to the receiver 42 through the matching circuit 41.

As with a typical demodulator, in accordance with various control signals received from the DBB/CPU 50, the receiver 42 down-convers the differential signals 102$p$ and 102$n$ into the baseband, and outputs IQ signals obtained by the down-conversion to the DBB/CPU 50. Note that although the example shown in FIG. 1 deals with a case where the transmitter 31 and the receiver 42 are mounted on the same RFIC (Radio Frequency Integrated Circuit) 60, they may be disposed independently of each other.

On the other hand, unlike the typical demodulator, the receiver 42 includes a phase/gain regulator 43. The phase/gain regulator 43 regulates at least phases of the differential signals 102$p$ and 102$n$ as will be described later, based on a result obtained by comparing a characteristic of the reception signal under a condition that the transmission signal 110 is not output with a characteristic of the reception signal under a condition that the transmission signal 110 is output.

As an example of the characteristics of the reception signal, this exemplary embodiment deals with a case of comparing receiving sensitivities under both conditions. For example, it is possible to use as the receiving sensitivity a BER (Bit Error Rate) which can be obtained by decoding, at the DBB/CPU 50, the IQ signals output from the receiver 42.

Next, operations of this exemplary embodiment will be described in detail with reference to FIG. 2.

Assume that the transmission signal 101 is input to the duplexer 30 and wirelessly sent out through the antenna 10, but in fact is leaked into the receiving circuit 40 while being attenuated by the amount corresponding to isolation of the duplexer 30 between transmission and reception.

There is explained an example of calculating power of the transmission signal leaked into the receiving circuit 40 (hereinafter, this signal will be referred to as "leaked signal"). Assuming that output power of the power amplifier 23 is "+26.5 dBm", insertion loss resulting from the isolator 24 is "0.5 dB" and insertion loss resulting from the duplexer 30 regarding a transmission band is "2 dB", power Pout of the transmission signal 101 output from the antenna 10 can be represented by the following expression (1). Further, assuming that the isolation between transmission and reception is "50 dB", power Ptxrx of the leaked signal can be obtained as shown in the following expression (2).

$$P\text{out} = +26.5\ \text{dBm} - 0.5\ \text{dB} - 2\ \text{dB} = +24.0\ \text{dBm} \qquad \text{Exp}(1)$$

$$P\text{txrx} = +26.5\ \text{dBm} - 0.5\ \text{dB} - 50\ \text{dB} = -24.0\ \text{dBm} \qquad \text{Exp}(2)$$

The leaked signal, and the differential signals 102$p$ and 102$n$ are input to the receiver 42 through the matching circuit 41.

As described above, the isolation of the duplexer 30 between transmission and reception depends on the imbalance between differential lines from the duplexer 30 to the receiving circuit 40 (in the example shown in FIG. 1, differential lines from the duplexer 30 to the matching circuit 41 and differential lines from the matching circuit to the receiver 42), the imbalance between input impedances corresponding to differential lines within the receiving circuit 40 (in the example shown in FIG. 1, input impedance of the receiver 42). This indicates that there is a high possibility that the isolation between transmission and reception is impaired depending on circuit board design, and thus is undesirable in terms of the design.

Therefore, in this exemplary embodiment, the phase/gain regulator 43 corrects the above-mentioned imbalance.

Figure 2:
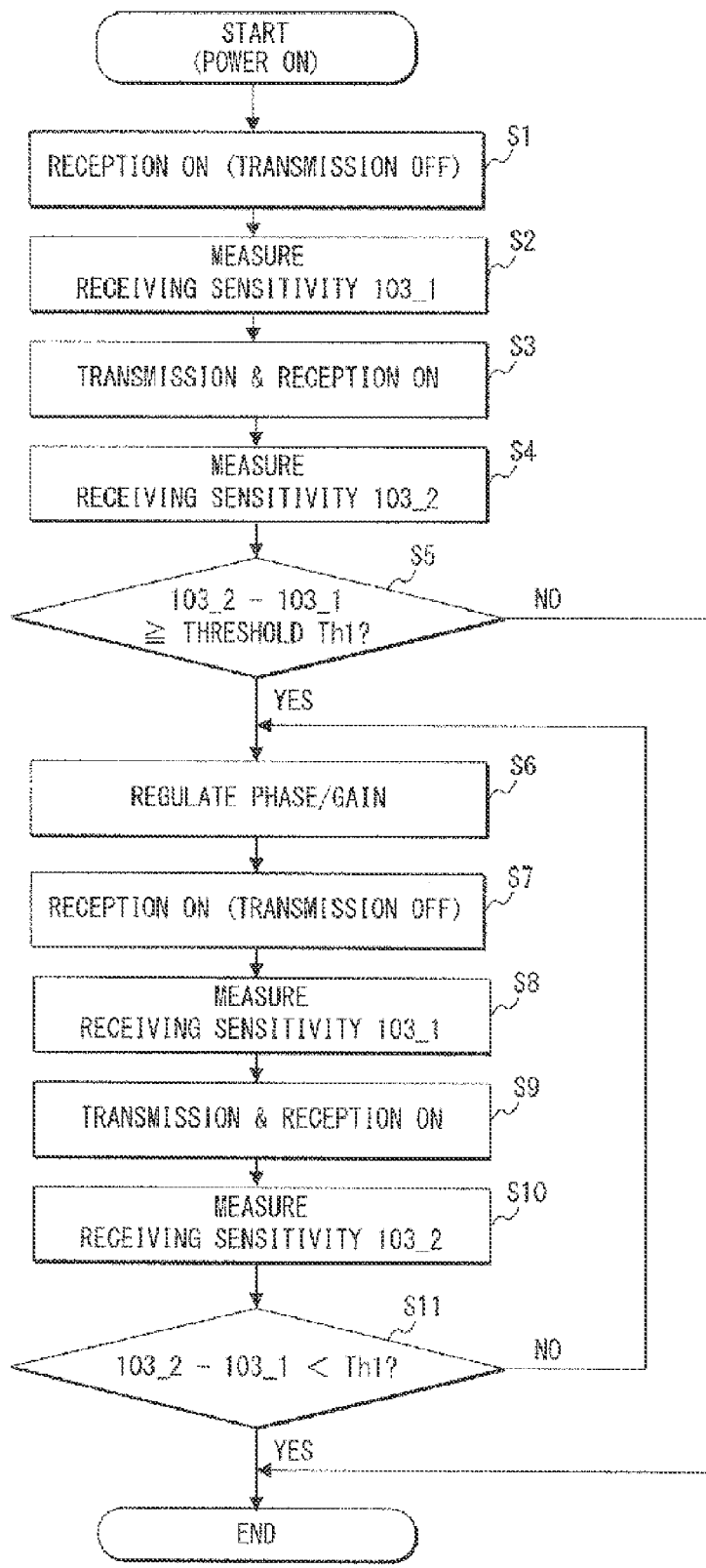
FIG. 2 is a flowchart showing an operation example of the radio transceiver according to the first exemplary embodiment of the present invention.

Specifically, as shown in FIG. 2, when the radio transceiver 1 is powered on, the DBB/CPU 50 firstly operates only the receiver 42 by use of the control signal (Step S1). At this time, the transmitter 21 has stopped outputting the transmission signal 101. Under this condition, the DBB/CPU 50 measures a receiving sensitivity 103_1 (Step S2). The receiving sensitivity 103_1 is transferred as the control signal to the phase/gain regulator 43.

Next, the DBB/CPU 50 operates the transmitter 21 by use of the control signal (Step S3). Thus, the transmitter 21 starts to output the transmission signal 10, so that transmission and reception are simultaneously performed. Under this condition, the DBB/CPU 50 measures a receiving sensitivity 103_2 (Step S4). The receiving sensitivity 103_2 is transferred as the control signal to the phase/gain regulator 43.

Then, the phase/gain regulator 43 determines whether or not a difference between the receiving sensitivities 103_1 and 103_2 is equal to or greater than a predetermined threshold Th1 (e.g., 0.5 dB) (Step S5). As a result, if "difference<threshold Th1" is satisfied, the phase/gain regulator 43 determines that the receiving sensitivity is satisfactory even at the time of transmission (in other words, the isolation is ensured between transmission and reception, so that reception performance is not deteriorated), and then terminates the processing.

On the other hand, if "difference≥threshold Th1" is satisfied, the following Steps S6 to S11 are repeatedly executed.

Firstly, the phase/gain regulator 43 regulates phases of the differential signals 102p and 102n. For example, the phase/gain regulator 43 varies, by a certain amount, the phase of the differential signal 102n (Negative side) relative to that of the differential signal 102p (Positive side) (Step S6).

At this time, as in the case of the above-mentioned Steps S1 to S4, the DBB/CPU 50 re-measures the receiving sensitivity 103_1 under the condition that the transmission signal 101 is not output, and the receiving sensitivity 103_2 under the condition that the transmission signal 101 is output (Steps S7 to S10).

Then, the phase/gain regulator 43 determines whether or not the difference between the receiving sensitivities 103_1 and 103_2 is less than the threshold Th1 (Step S111). As a result, if "difference≥threshold Th1" is maintained, the phase/gain regulator 43 determines that the receiving sensitivity has not been sufficiently improved (in other words, the above-mentioned imbalance has not been sufficiently corrected), and thus returns to the above-mentioned Step S6 to vary the phase of the differential signal 102n even further.

On the other hand, if "difference<threshold Th1" is satisfied, the above-mentioned Steps S6 to S11 are repeatedly executed for the differential signal 102p (Positive side) by using the differential signal 102n (Negative side) as a criterion.

As a result, when "difference<threshold Th1" is satisfied at the above-mentioned Step S11, the phase/gain regulator 43 determines that the receiving sensitivity has been sufficiently improved (in other words, the above-mentioned imbalance has been sufficiently corrected), and then terminates the processing.

As described above, in this exemplary embodiment, the above-mentioned imbalance is corrected by regulating the phases of the differential signals. Therefore, it is possible to substantially reduce the deterioration of the reception performance in the case of simultaneously transmitting and receiving as compared with the typical radio transceiver, so that it is possible to achieve stable reception performance.

In addition, this exemplary embodiment also has the merit of achieving the following advantageous effects. Namely, flexibility of wiring layout is improved. This is because it is possible to ensure the isolation between transmission and reception without depending on the imbalance between the differential lines. Further, flexibility of circuit design is improved. This is because it is possible to tolerate the variability between the input impedances in the receiving circuit. Furthermore, the duplexer does not need to be provided with an excessive isolation characteristic between transmission and reception, and the receiving circuit does not need to be provided with excessive performance needed for improving the tolerance against the inter modulation.

Further, if the phase is greatly varied at the above-mentioned Steps S6 to S11, it may lead to the imbalance between gains of the differential signals 102p and 102n. In order to address this imbalance, it is preferable to regulate the gains of the differential signals 102p and 102n.

In this case, the phase/gain regulator 43 determines the gain in the same procedure as the phase regulation (for the differential signal 102n (Negative side)) based on a difference between the receiving sensitivities 103_1 and 103_2 after the phases are regulated, and then performs the gain regulation in a procedure for determining the gain of the differential signal 102p (Positive side).

Second Exemplary Embodiment

A radio transceiver according to this exemplary embodiment can be configured is a similar manner to the above-mentioned first exemplary embodiment. Meanwhile, this exemplary embodiment is different from the above-mentioned first exemplary embodiment, in that the phase/gain regulator 43 operates as shown in FIG. 3.

Figure 3:
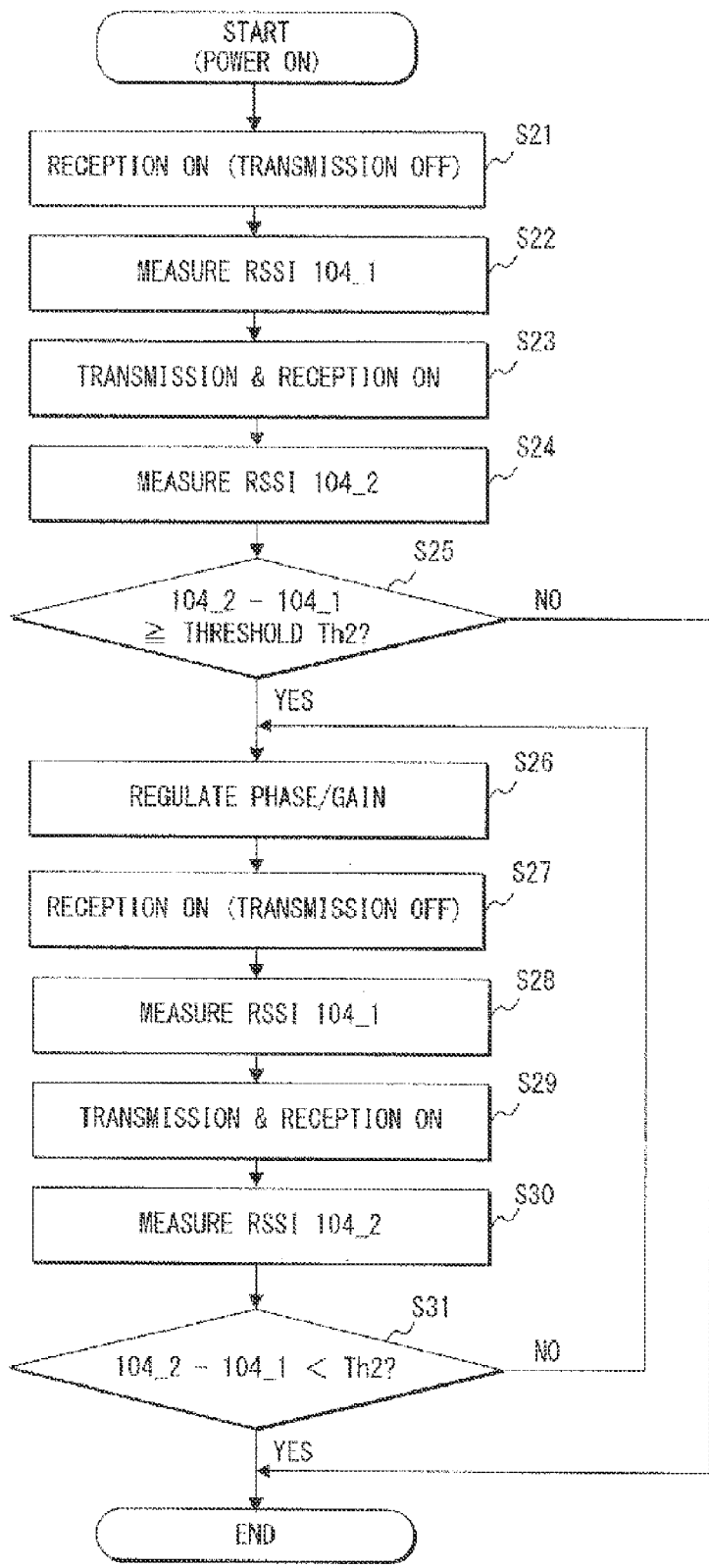
FIG. 3 is a flowchart showing an operation example of the radio transceiver according to the second exemplary embodiment of the present invention.

Specifically, as shown in FIG. 3, an RSSI (Received Signal Strength Indicator) 104_1 under the condition that the transmission signal 101 is not output, and an RSSI 104_2 under the condition that the transmission signal 101 is output are measured as characteristics of the reception signal, which substitute for the above-mentioned receiving sensitivities (Steps S21 to S24). The RSSI can be calculated by the DBB/CPU 50 based on the gain at the receiver 42 and the power of IQ signals output from the receiver 42.

At this time, the phase/gain regulator 43 determines whether or not a difference between the RSSIs 104_1 and 104_2 is equal to or greater than a predetermined threshold Th2 (e.g., 1.0 dB) (Step S25). As a result, if "difference<threshold Th2" is satisfied, the phase/gain regulator 43 determines that the RSSI is satisfactory even at the time of transmission and then terminates the processing.

On the other hand, if "difference≥threshold Th2" is satisfied, the following Steps S26 to S31 are repeatedly executed.

Firstly, the phase/gain regulator 43 regulates the phases of the differential signals 102p and 102n as in the case of the above-mentioned Step S6 (Step S26).

At this time, the DBB/CPU 50 re-measures the RSSI 104_1 under the condition that the transmission signal 101 is not output, and the RSSI 104_2 under the condition that the transmission signal 101 is output (Steps S27 to S30).

Then, the phase/gain regulator 43 determines whether or not the difference between the RSSIs 104_1 and 104_2 is less than the threshold Th2 (Step S31). As a result, if "difference≥threshold Th2" is maintained, the phase/gain regulator 43 determines that the above-mentioned imbalance has not been sufficiently corrected, and thus returns to the above-mentioned Step S26 to regulate the phases of the differential signals 102p and 102n even further.

On the other hand, if "difference<threshold Th2" is satisfied, the phase/gain regulator 43 determines that the above-mentioned imbalance has been sufficiently corrected, and then terminates the processing.

As described above, in this exemplary embodiment, the above-mentioned imbalance is corrected by regulating the phases of the differential signals as with the above-mentioned first exemplary embodiment. Therefore, it is possible to reduce the deterioration of the reception performance in the case of simultaneously transmitting and receiving, so that it is possible to achieve the same advantageous effects as those in the above-mentioned first exemplary embodiment.

Further, the RSSI can be calculated by simpler processing than that for the above-mentioned receiving sensitivity (e.g., the BER). Therefore, this exemplary embodiment has the merit of performing the phase regulation faster than the above-mentioned first exemplary embodiment.

Note that if the phase is greatly varied at the above-mentioned Steps S26 to S31, it may lead to the imbalance between gains of the differential signals 102p and 102n. In order to address this imbalance, it is preferable to regulate the gains of the differential signals 102p and 102n. In this case, the phase/ gain regulator 43 performs the gain regulation in the same procedure as the phase regulation based on a difference between the RSSIs 104_1 and 104_2 after the phases are regulated.

Third Exemplary Embodiment

Figure 4:
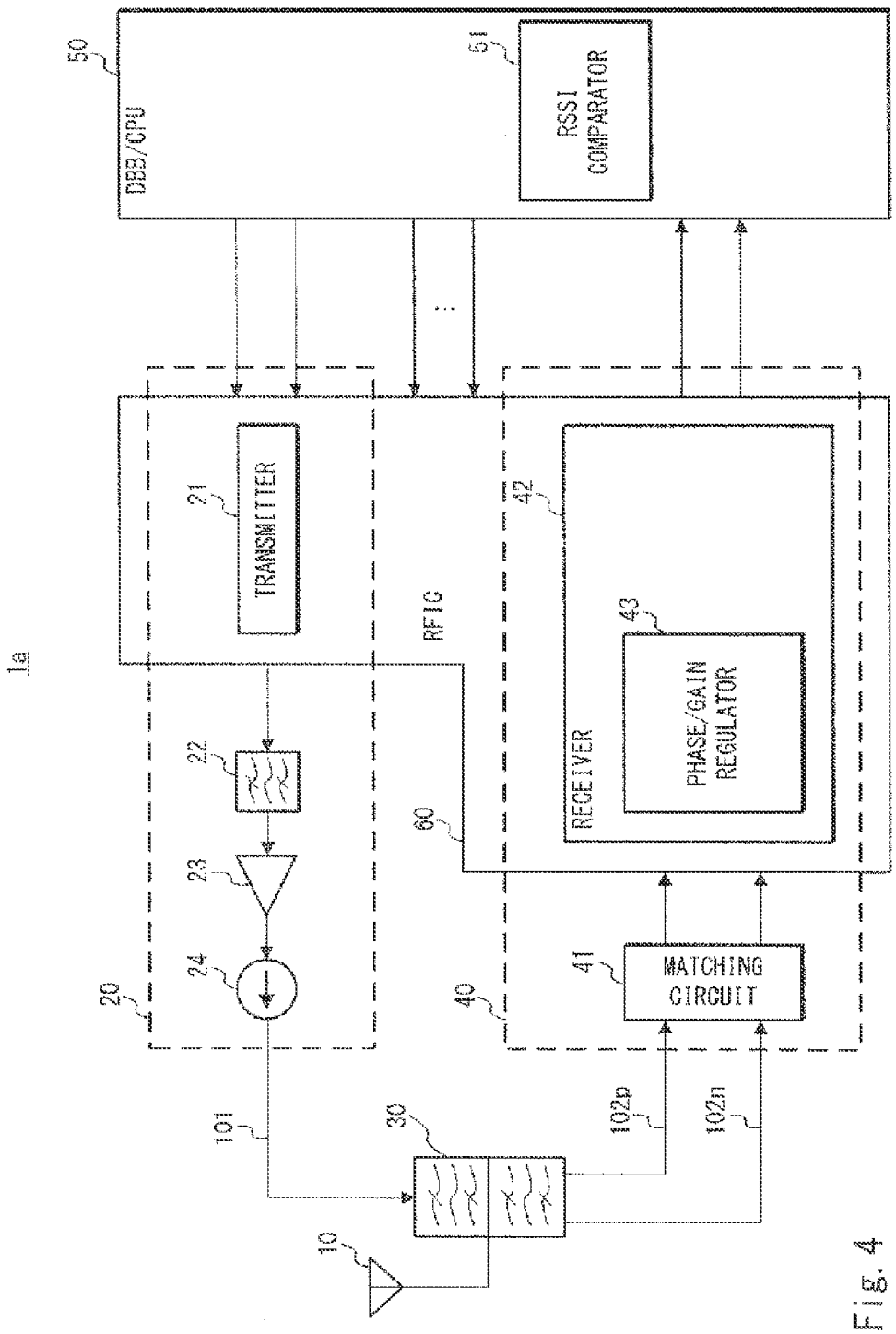
FIG. 4 is a block diagram showing a configuration example of a radio transceiver according to a third exemplary embodiment of the present invention.

As shown in FIG. 4, a radio transceiver 1a according to this exemplary embodiment is different from that according to the above-mentioned second exemplary embodiment, in that the DBB/CPU 50 is provided therein with an RSSI comparator 51 which performs the above-mentioned comparison of RSSIs (comparison of the difference between the RSSIs 104_1 and 104_2 with the threshold Th2).

Thus, the radio transceiver 1a can automatically correct the above-mentioned imbalance at an arbitrary timing which is not limited to the time when the radio transceiver 1a is powered on or the like.

Figure 5:
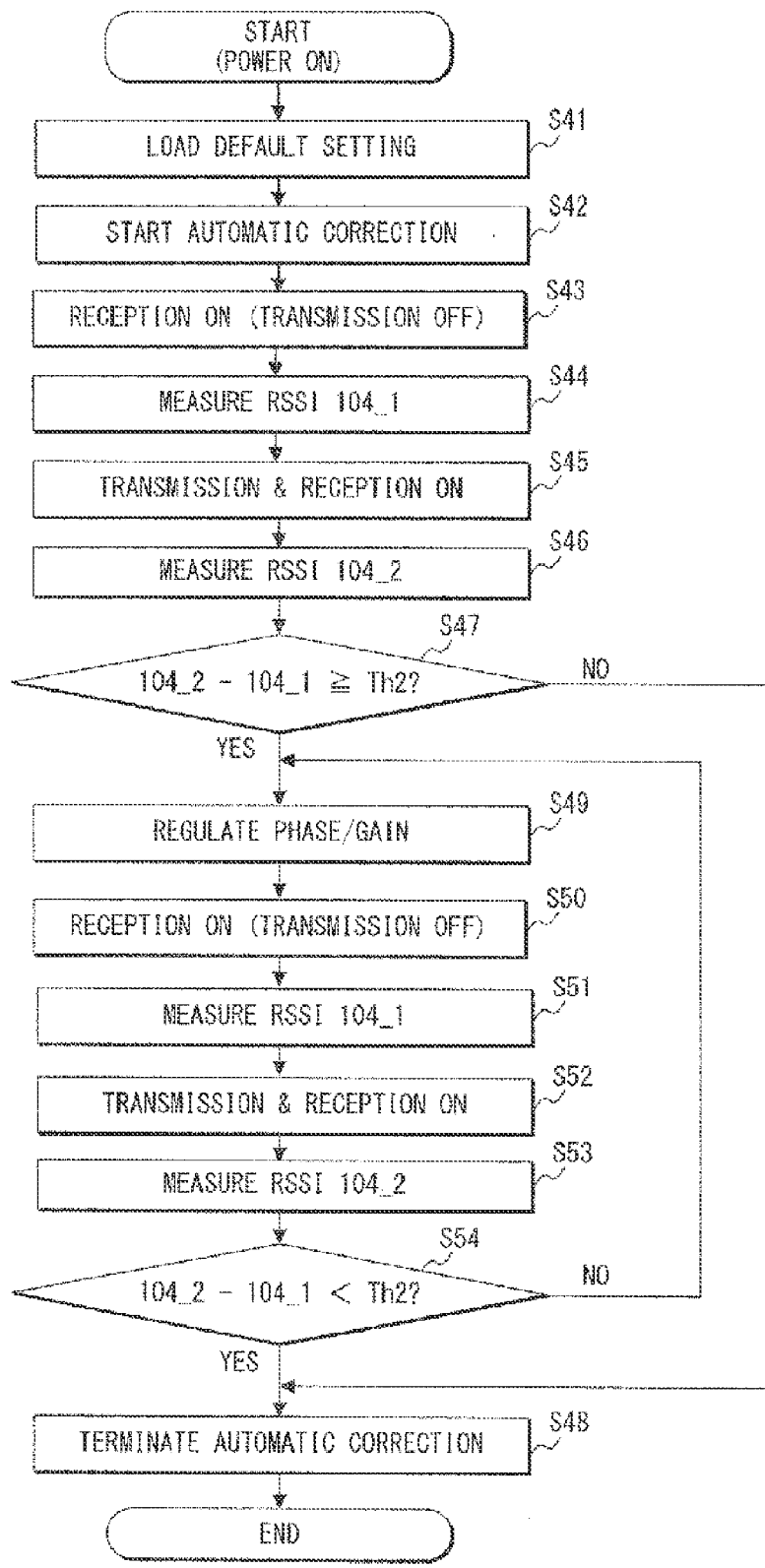
FIG. 5 is a flowchart showing an operation example of the radio transceiver according to the third exemplary embodiment of the present invention.

Specifically, as shown in FIG. 5, the DBB/CPU 50 loads the default setting into e.g., the RFIC 60 (Step S41), and then determines to start the automatic correction (Step S42). At this time, as in the case of the above-mentioned Steps S21 to S24, the DBB/CPU 50 measures the RSSI 104_1 under the condition that the transmission signal 101 is not output, and the RSSI 104_2 under the condition that the transmission signal 101 is output (Steps S43 to S46).

Then, the RSSI comparator 51 determines whether or not the difference between the RSSIs 104_1 and 104_2 is equal to or greater than the threshold Th2 (Step S47). As a result, if "difference<threshold Th2" is satisfied, the RSSI comparator 51 determines that the RSSI is satisfactory even at the time of transmission, and then terminates the automatic correction (Step S48).

On the other hand, if "difference≥threshold Th2" is satisfied, the RSSI comparator 51 outputs, as one of the control signals, a trigger signal for causing the phase/gain regulator 43 to perform the phase and gain regulation shown at Step S26 in FIG. 3 (Step S49). The RSSI comparator 51 repeatedly outputs this trigger signal until "difference<threshold Th2" is satisfied, thereby causing the phase/gain regulator 43 to perform the same phase and gain regulation as that in the above-mentioned second exemplary embodiment (Steps S50 to S54).

As a result, if it is determined at the above-mentioned Step S54 that "difference<threshold Th2" is satisfied, the RSSI comparator 51 proceeds to the above-mentioned Step S48 to terminate the automatic correction.

Note that the present invention is not limited to the above-mentioned exemplary embodiments, and it will be understood by those of ordinary skill in the art that various changes in form and details may be made therein without departing from the spirit and scope of the present invention as defined by the claims.

This application is based upon and claims the benefit of priority from Japanese patent application No. 2010-266136, filed on Nov. 30, 2010, the disclosure of which is incorporated herein in its entirety by reference.

INDUSTRIAL APPLICABILITY

The present invention can be applied to a radio transceiver, and particularly applied to a mobile phone and a mobile communication device employing a communication system such as the WCDMA system in which transmission and reception are simultaneously performed.

The whole or part of the exemplary embodiments disclosed above can be described as, but not limited to, the following supplementary notes.

(Supplementary Note 1)

A radio transceiver comprising:

transmission means for outputting a transmission signal to be wirelessly transmitted through an antenna;

antenna duplex means for conducting the transmission signal to the antenna, and for outputting, as differential signals, a reception signal wirelessly received through the antenna; and reception means, the differential signals being input to the reception means, wherein the reception means is configured to regulate phases of the differential signals based on a first characteristic of the reception signal under a condition that the transmission signal is not output, and a second characteristic of the reception signal under a condition that the transmission signal is output.

(Supplementary Note 2)

The radio transceiver according to Supplementary note 1, wherein the reception means is configured to:

compare, as the first and second characteristics, receiving sensitivities of the reception signal under both of the conditions; and regulate the phases of the differential signals relatively so that a difference between the receiving sensitivities becomes less than a predetermined threshold.

(Supplementary Note 3)

The radio transceiver according to Supplementary note 1, wherein the reception means is configured to:

compare, as the first and second characteristics, received strengths of the reception signal under both of the conditions; and regulate the phases of the differential signals relatively so that a difference between the received strengths becomes less than a predetermined threshold.

(Supplementary Note 4)

The radio transceiver according to Supplementary note 1, further comprising:

control means for comparing, as the first and second characteristics, received strengths of the reception signal under both of the conditions, and for instructing, until a difference between the received strengths becomes less than a predetermined threshold, the reception means to relatively regulate the phases of the differential signals.

(Supplementary Note 5)

The radio transceiver according to Supplementary note 1, wherein the reception means is configured to regulate gains of the differential signals based on a result obtained by comparing the first and second characteristics after the regulation of phases.

(Supplementary Note 6)

The radio transceiver according to Supplementary note 5, wherein the reception means is configured to:

compare, as the first and second characteristics, receiving sensitivities of the reception signal under both of the conditions; and regulate the gains of the differential signals relatively so that a difference between the receiving sensitivities becomes less than a predetermined threshold.

(Supplementary Note 7)

The radio transceiver according to Supplementary note 5, wherein the reception means is configured to:

compare, as the first and second characteristics, received strengths of the reception signal under both of the conditions; and regulate the gains of the differential signals relatively so that a difference between the received strengths becomes less than a predetermined threshold.

(Supplementary Note 8)

The radio transceiver according to Supplementary note 5, further comprising:

control means for comparing, as the first and second characteristics, received strengths of the reception signal under both of the conditions, and for instructing, until a difference between the received strengths becomes less than a predetermined threshold, the reception means to relatively regulate the gains of the differential signals.

(Supplementary Note 9)

A method of controlling a radio transceiver that uses a duplexer for conducting to an antenna a transmission signal to be wirelessly transmitted and for propagating a reception signal wirelessly received through the antenna in a differential manner, the method comprising:

comparing a first characteristic of the reception signal under a condition that the transmission signal is not output with a second characteristic of the reception signal under a condition that the transmission signal is output; and regulating phases of signals propagated in the differential manner based on a result of the comparison.

(Supplementary Note 10)

The method according to Supplementary note 9, further comprising:

comparing, as the first and second characteristics, receiving sensitivities of the reception signal under both of the conditions; and regulating the phases of the signals propagated in the differential manner relatively so that a difference between the receiving sensitivities becomes less than a predetermined threshold.

(Supplementary Note 11)

The method according to Supplementary note 9, further comprising:

comparing, as the first and second characteristics, received strengths of the reception signal under both of the conditions; and regulating the phases of the signals propagated in the differential manner relatively so that a difference between the received strengths becomes less than a predetermined threshold.

(Supplementary Note 12)

The method according to Supplementary note 9, further comprising:

regulating gains of the signals propagated in the differential manner based on a result obtained by comparing the first and second characteristics after the regulation of phases.

(Supplementary Note 13)

The method according to Supplementary note 12, further comprising:

comparing, as the first and second characteristics, receiving sensitivities of the reception signal under both of the conditions; and regulating the gains of the signals propagated in the differential manner relatively so that a difference between the receiving sensitivities becomes less than a predetermined threshold.

(Supplementary Note 14)

The method according to Supplementary note 12, further comprising:

comparing, as the first and second characteristics, received strengths of the reception signal under both of the conditions; and regulating the gains of the signals propagated in the differential manner relatively so that a difference between the received strengths becomes less than a predetermined threshold.

REFERENCE SIGNS LIST 1, 1a RADIO TRANSCEIVER
10 ANTENNA
20 TRANSMITTING CIRCUIT
21 TRANSMITTER
22 BANDPASS FILTER
23 POWER AMPLIFIER
24 ISOLATOR
30 DUPLEXER
40 RECEIVING CIRCUIT
41 MATCHING CIRCUIT
42 RECEIVER
43 PHASE/GAIN REGULATOR
50 DBB/CPU
51 RSSI COMPARATOR
60 RFIC
101 TRANSMISSION SIGNAL
102$p$, 102$n$ DIFFERENTIAL SIGNAL
103_1, 103_2 RECEIVING SENSITIVITY
104_1, 104_2 RSSI
Th1, Th2 THRESHOLD

The invention claimed is:

1. A radio transceiver comprising:
a transmitter that outputs a transmission signal to be wirelessly transmitted through an antenna;
a duplexer that conducts the transmission signal to the antenna, and that outputs, as differential signals, a reception signal wirelessly received through the antenna; and
a receiver, the differential signals being input to the receiver,
wherein the receiver is configured to regulate phases of the differential signals based on a first characteristic of the reception signal under a condition that the transmission signal is not output, and a second characteristic of the reception signal under a condition that the transmission signal is output, and
wherein the receiver is configured to:
compare, as the first and second characteristics, receiving sensitivities of the reception signal under both of the conditions; and
regulate the phases of the differential signals relatively so that a difference between the receiving sensitivities becomes less than a predetermined threshold.

2. The radio transceiver according to claim 1, wherein the receiver is further configured to regulate gains of the differential signals based on a result obtained by comparing the first and second characteristics after the regulation of phases.

3. A method of controlling a radio transceiver that uses a duplexer for conducting to an antenna a transmission signal to be wirelessly transmitted and for propagating a reception signal wirelessly received through the antenna in a differential manner, the method comprising:
comparing a received strength of the reception signal under a condition that the transmission signal is not output with a received strength of the reception signal under a condition that the transmission signal is output; and
regulating phases of signals propagated in the differential manner based on a result of the comparison so that a difference between the received strengths becomes less than a predetermined threshold.

4. The method according to claim 3, further comprising:
  regulating gains of the signals propagated in the differential manner based on a result obtained by comparing the received strengths after the regulation of phases.

* * * * *